United States Patent [19]

Park

[11] Patent Number: 5,148,216
[45] Date of Patent: Sep. 15, 1992

[54] CARTRIDGE FOR CONTAINING FILM PAPERS AND PRINTING PAPERS AND A COLOR VIDEO PRINTER USING THE CARTRIDGE

[75] Inventor: Hyun K. Park, Seoul, Rep. of Korea

[73] Assignee: Goldstar Co., Ltd., Seoul, Rep. of Korea

[21] Appl. No.: 674,220

[22] Filed: Mar. 25, 1991

[30] Foreign Application Priority Data

Mar. 24, 1990 [KR] Rep. of Korea ............... 3470/1990

[51] Int. Cl.[5] ........................................... G03B 27/58
[52] U.S. Cl. ..................................... 355/72; 355/27
[58] Field of Search ............... 355/72, 27; 352/130, 352/158; 354/85, 86

[56] References Cited

U.S. PATENT DOCUMENTS

| | | | |
|---|---|---|---|
| 3,586,430 | 6/1971 | Rempala | 352/158 |
| 4,903,071 | 2/1990 | Ohno | 355/27 |
| 5,014,084 | 5/1991 | Tirone | 355/27 |

Primary Examiner—Monroe H. Hayes

[57] ABSTRACT

A cartridge for a color video printer comprises a cartridge body with a film paper section occupying a part of a space inside the cartridge body and a container for containing the printing papers and occupying the other part of the space inside the cartridge body. The film paper section for containing film papers consists of a supply reel and a take-up reel mounted inside the cartridge body. A discharge hole and a inlet hole are formed on a top plate of the cartridge body. The printing paper container consists of a container with one of its side walls open. A color vide printer using the cartridge has a pair of loading rollers for automatically loading the film papers, a FO-CRT for exposing an image to be printed onto the film papers, a capstan shaft, a pinch roller, a belt interlocking the pinch roller and one of the loading rollers, a pair of pressing rollers, a pair of guide rollers, and a fixing unit for fixing the transcribed image of the printing papers. The film papers and the printing papers are contained in one cartridge and replacement of the printing papers and an exchange operation of the film papers can be carried out simply. Also, the color video printer is compact.

15 Claims, 2 Drawing Sheets

CARTRIDGE FOR CONTAINING FILM PAPERS AND PRINTING PAPERS AND A COLOR VIDEO PRINTER USING THE CARTRIDGE

BACKGROUND OF THE INVENTION

The present invention relates to a cartridge for containing film papers and printing papers and a color video printer using the cartridge.

General color video printers include two separate cartridge containing printing papers and a film paper therein, respectively. Their typical example will be described in conjunction with an accompanying drawing.

Referring to FIG. 1, there is shown a conventional color-mode color video printer. The printer comprises an optical unit 1, a transport unit 2, a printing paper supply unit 3, a pressure developing unit 4, a heat fixing unit 5, a film paper (or color paper) supply unit 6, and a film paper take-up unit 7.

In printing operation of the above-mentioned color video printer, an image of an original paper 8 to be printed passes through the optical unit 1 and is then exposed on a film paper 6' fed from the film paper supply unit 6. The image-projected film paper 6' is fed to the pressure developing unit 4, together with a printing paper 3' fed from a printing paper supply unit 3 and overlapped with said film paper 6'. In the pressure developing unit 4, the picture from the original paper 8 projected on the film paper 6' is transcribed onto printing paper 3'. Passing through the heat fixing unit 5, the printing paper 3' is then discharged. Simultaneously, the film paper 6' is taken up on the film take-up unit 7. Thus, a series of printing steps is completed.

In the above printing operation, the transport unit 2 is generally adapted to function as a guide for the film paper 6' and the printing paper 3'.

However, such conventional color video printer with the above-mentioned construction having the printing paper supply unit 3 mounted separately from the film paper supply unit 6 has some problems in that the printing paper supply unit 3 and the film paper supply unit 6 should be separated from the printer body 9 in supplementing or exchanging the printing papers 3' and the film papers 6' that they and take up much space inside the printer body 9, thereby enlarging the volume of the body 9.

SUMMARY OF THE INVENTION

Accordingly it is an object of the present invention to provide, for solving the above mentioned problems of the hitherto used cartridges, a cartridge for a color video printer in which printing papers and film papers are contained in a case.

It is another object of the present invention to provide a compact color video printer with such a cartridge.

In accordance with the present invention, there is provided a cartridge of a color video printer for containing film papers and printing papers comprising a cartridge body, a supply reel and a take-up reel mounted in a space inside the cartridge body for supplying and taking up the film papers, a discharge hole and an inlet hole formed on a top plate of the cartridge body for discharging, and receiving the film papers, and a container formed to occupy the other space inside the cartridge body for containing the printing papers therein.

Also according to the present invention, there is provided a color video printer using such a cartridge comprising a detachable cartridge, including a discharge hole and a inlet hole. The cartridge contains film papers and printing papers. An exposing means exposes an image to be printed on the film paper fed from the discharge hole of the cartridge. A pressure developing means presses the film paper and the printing paper in order to transcribe the image exposed on the film paper onto the printing paper. A fixing means fixes the transcribed image of the printing paper and discharges the fixed printing paper.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Hereinafter, the present invention will be described in more detail in conjunction with the attached drawings, which are given by way of illustration only, and thus are not limitative of the present invention, and in which.

DETAILED DESCRIPTION OF PREFERRED EMBODIMENTS

Figure 1:
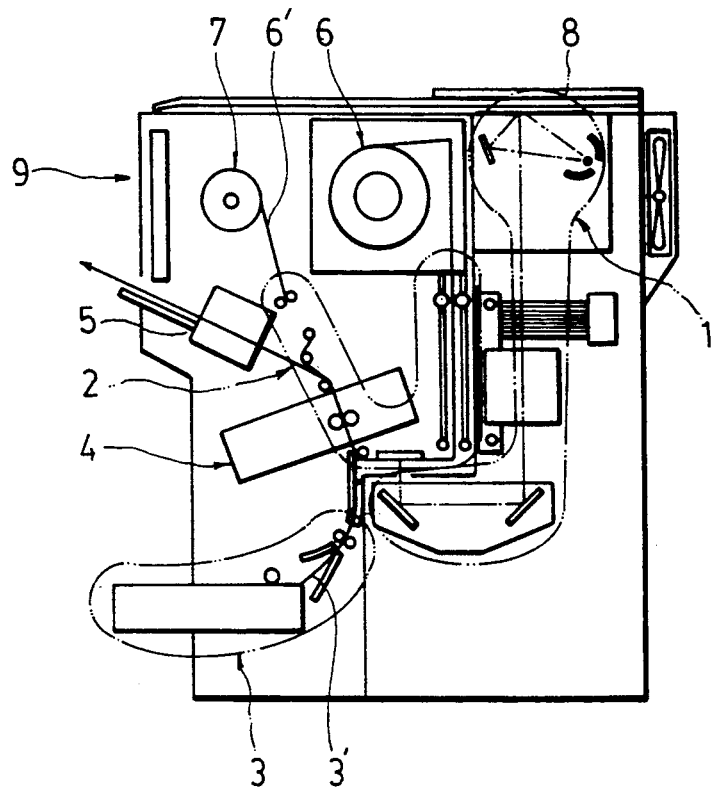
FIG. 1 is a schematic view showing an internal construction of a conventional color video printer.
Figure 2:
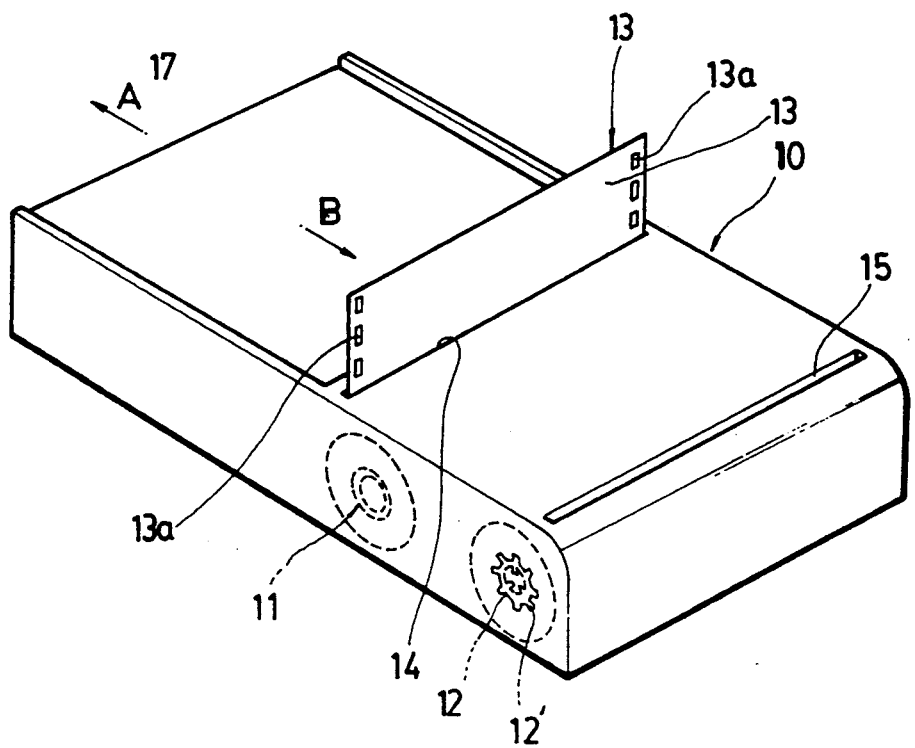
FIG. 2 is a perspective view of a cartridge for containing printing papers and film papers in accordance with the present invention.

Turning now to the details of the drawings, FIG. 2 is a schematic view of a cartridge for containing printing papers and film papers according to the present invention.

As shown in FIG. 2, the cartridge comprises a cartridge body 10 which consists of a film paper section and a printing paper section. The film paper section occupies almost half of the space inside the cartridge body 10. This film paper section is provided with a supply reel 11 and a take-up reel 12 rotatably mounted therein. The supply reel 11 is wound with film papers 13. Film papers 13 have holes 13a on both sides thereof. Also, the take-up reel 12 includes a number of sprocket teeth 12' for automatic loading of the film papers 13. Teeth 12' are formed peripherally around both ends of reel 12. Thus, in operation, the take-up reel 12 rotates with the film papers 13 on the sprocket teeth 12', so that the film papers 13 can be taken up around the take-up reel 12.

Also, there are a narrow, long discharge hole 14 and an inlet hole 15 for discharging and supplying the film papers 13 therefrom individually. These holes 14 and 15 are laterally formed on a top plate of the body 10. Thus, the film papers 13 wound around the supply reel 11 may be supplied from the discharge hole 14, and return to be taken up around the take-up reel 12 through the inlet hole 16 after passing through a series of passage.

On the other hand, the printing paper section, occupying the other space inside the body 10 comprises a printing paper container 16 having a predetermined depth. A side of body 10 is (in FIG. 3). Thus, the printing papers 17 in the container 16 may be selectively discharged in the direction A or B as indicated by the arrows in FIG. 2 depending on constructions of the printers.

Figure 3:
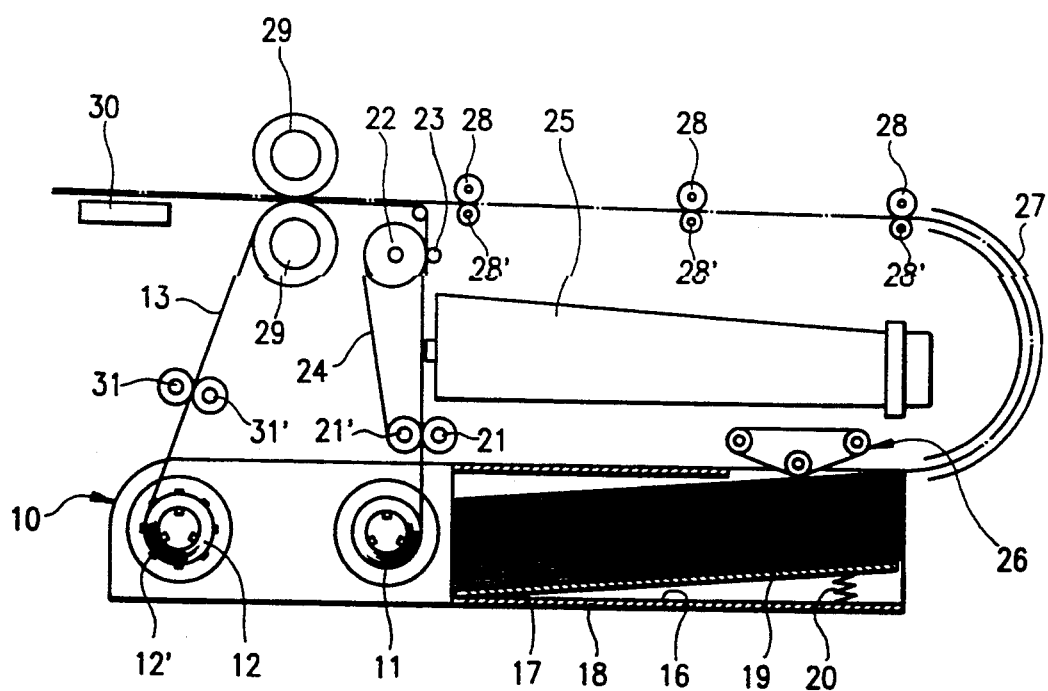
FIG. 3 is a schematic view showing an internal construction of a color video printer in which the cartridge of FIG. 2 is attached.

In addition, there may be a paper support of various types on the surface of a bottom plate 18 of the body 10 for support the printing papers 17 in order to run a pick-up operation for the printing papers more smoothly (see FIG. 3).

For the above-mentioned paper support, a conventional compressed plate, hitherto used in general duplicators and comprising a plate 19 being laid on the bottom plate 18 and a compressed spring 20 positioned under the plate for elastically and upwardly supporting it may be used.

FIG. 3 is a schematic view showing the inside of a color video printer with such a cartridge attached in a lower side thereof. As shown in the drawing, the color video printer is provided with a pair of loading rollers 21 and 21' mounted over the attached cartridge body 10 in an optimum space, a pinch roller 22 and a capstan shaft 23 mounted over the loading rollers 21 and 21'. The pinch rollers 22 and 21' of the loading rollers 21 and 21' are interlocked by a belt 24, thus the film papers 13 can be fed by the rotation of the capstan shaft 23.

Also, the color video printer is provided with a FO (fiber optics) —CRT (cathode ray tube) 25 for exposing the film papers 13, mounted at a back portion between the loading rollers 21 and 21' and the capstan shaft 23, and a pick-up roller assembly 26 mounted below the FO-CRT 25 for picking up the printing papers 17.

The passage for feeding the printing papers 17 is provided with a paper guide 27 and several pairs of paper distributing rollers 28 and 28'. Also, the passage for feeding the printing papers 17 and the film papers 13 simultaneously is provided with a pair of pressing rollers 29 and 29'. In addition, there is a fixing unit 30 for fixing the exposed image of the printing papers 17 downstream from the pressing rollers 29 and 29'. A pair of guide rollers 31 and 31' are positioned between the take-up reel 12 of the cartridge body 10 and the pressing rollers 29 and 29'.

In loading operation of the film papers 13, after the cartridge body 10 is inserted into the color video printer, the film papers 13 of an optimum length are extruded from the discharge hole 14 of the body 10 by rotation of the supply reel 11, a starting end of the film papers 13 is then pinched between the loading rollers 21 and 21'. Thereafter, the film papers 13 passes through a passage of the pinch roller 22 and the capstan shaft 23, the pressing rollers 29 and 29' and the guide rollers 31 and 31' sequentially. The film papers 13 from the guide rollers 31 and 31' return to the cartridge body 10 through the inlet hole 15, the holes 13a thereof are then hooked by the sprocket teeth 12' of the take-up reel 12. Thus a loading operation of the film papers 13 is completed.

In a printing operation after loading of the film papers 13, the film papers 13 are fed at in a predetermined speed by the capstan shaft 23 and have an image exposed thereon by the FO-CRT 25 positioned between the loading rollers 21 and 21' and the capstan shaft 23. The exposed film papers 13 continuously pass through the above-mentioned passage. Simultaneously, the printing papers 17 are discharged from the container 16 by the pick-up roller assembly 26 and are guided through the passage by the guide 27 and the distributing rollers 28 and 28'. Thus, the film papers 13 and the printing papers 17 can simultaneously pass through the pressing rollers 29 and 29'. At this time, an image exposed on the film paper 13 is transcribed on the printing paper 17 as a result of the pressure-developing of cylith particles of the film papers 13 onto the surface of the printing papers 17 by pressing power. Thereafter, the printing papers 17 with the images transcribed thereon are heat-fixed by the fixing unit 30, and are then discharged outside the video printer. Also, the film papers 13 are taken up around the take-up reel 12 of the cartridge body 10.

Accordingly, in accordance with the present invention, the film papers and the printing papers are contained in a cartridge which provides advantages that the replacement of the printing papers and the exchange of the film papers can be carried out by a simple exchange of the cartridge. Also, the volume of the color video printer can be reduced as a result of simplification of the construction of the cartridge. While the instant cartridge has been discussed as being used with a color video printer, it should be understood that a photosensitive printing type color video printer or a thermal printing type color video printer could be used or even a color copier can be used.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A cartridge for a color printer, the cartridge comprising:

a cartridge body having a film paper section and a printing paper section, the film paper section and the printing paper section being side-by-side in the cartridge body, the cartridge body with the film paper section and the printing paper section being a single, one piece structure;

a supply reel and a take-up reel mounted in the film paper section of the cartridge body, the supply reel supplying film paper and the take-up reel receiving the film paper;

a discharge hole and an inlet hole formed on a top side of the cartridge body, film paper being discharged from the cartridge body through the discharge hole and being returned to the cartridge body through the inlet hole; and a container positioned in the printing paper section of the cartridge body for holding printing papers.

2. The cartridge for a color printer as claimed in claim 1, wherein the take-up reel has a plurality of sprocket teeth formed on each end thereof, the film paper having a plurality of holes formed along sides thereof, and the sprocket teeth being insertable in the holes in the sides of the film paper.

3. The cartridge for a color printer as claimed in claim 1, wherein the discharge hole is positioned at a midsection of the cartridge body and wherein the inlet hole is positioned at a forward end of the cartridge body.

4. The cartridge for a color printer as claimed in claim 1, wherein the cartridge body has a printing paper opening defined therein for discharge of the printing papers from the printing paper section, the discharge hole being between the printing paper opening and the inlet hole.

5. The cartridge for a color printer as claimed in claim 1, wherein the supply reel and the take-up reel extend between a first and second opposed side of the cartridge body, the discharge hole and the inlet hole each having a longitudinal axis which extends between the first and second opposed sides of the cartridge body, the film paper section and the printing paper section being located between the first and second opposed sides of the cartridge body and the film paper section being located in front of the printing paper section such that the longitudinal axes of the discharge hole and the inlet hole fail to pass through the printing paper section.

6. The cartridge for a color printer as claimed in claim 1, wherein the film paper can be contained within the film paper section and the printing papers can be contained within the printing paper section, the cartridge body is insertable into and removable from the printer as a single unit to simultaneously insert and remove the film paper and the printing papers from the printer.

7. A color printer using a cartridge comprising:
a cartridge body having a film paper section and a printing paper section, a discharge hole and an inlet hole being defined on the cartridge body for discharging film paper from and receiving film paper into the cartridge body, the printing paper section holding printing papers therein, the cartridge body being a single one piece structure detachably mounted in the color printer, such that film paper and printing papers can simultaneously be inserted into and removed from the printer when the cartridge body is inserted into and removed from the printer;
a fiber optics cathode ray tube for exposing an image onto film paper withdrawn from the cartridge body, the fiber optics cathode ray tube being located above the cartridge body when the cartridge body is mounted in the color printer;
means for discharging and receiving film paper from the film paper section of the cartridge body, the means for discharging and receiving being located in the film paper section of the cartridge body;
means for feeding film paper from and returning the film paper to the film paper section of the cartridge body, the means for feeding moving the film paper past the fiber optics cathode ray tube such that the image can be exposed thereon;
means for withdrawing printing paper from the printing paper section of the cartridge body;
a pair of pressure rollers for simultaneously pressing the printing paper fed from the cartridge body and the film paper moved by the fiber optics cathode ray tube to transcribe the image exposed onto the film paper onto the printing paper; and
a fixing unit for fixing the image transcribed on the printing paper by the pair of pressure rollers.

8. The color printer as claimed in claim 7, wherein the means for discharging comprises a pair of loading rollers positioned adjacent the discharge hole in the cartridge body, a pinch roller, a capstan shaft and a belt interlocking at least one of the loading rollers and the pinch roller, the loading rollers, pinch roller and capstan shaft withdrawing the film paper from the cartridge body and feeding the film paper to the pair of pressure rollers.

9. The color printer as claimed in claim 8, wherein the means for discharging further comprises a pair of guide rollers for guiding the film paper from the pair of pressure rollers to the inlet hole in the cartridge body, the film paper being withdrawn from and returned to the means for discharging and receiving in the cartridge body.

10. The color printer as claimed in claim 9, wherein the means for discharging and receiving comprises a supply reel and a take-up reel mounted in the cartridge body.

11. The color printer as claimed in claim 9, wherein the means for discharging and receiving comprises a supply reel and a take-up reel mounted in the cartridge body.

12. The color printer as claimed in claim 7, wherein the means for withdrawing printing paper comprises a pick-up roller assembly and a paper guide, the pick-up roller assembly being positioned above the printing paper section of the cartridge body when the cartridge body is mounted in the printer, printing paper being withdrawn from the cartridge body by the pick-up roller assembly and being fed through the paper guide to the pair of pressure rollers.

13. The color printer as claimed in claim 12, wherein the means for withdrawing further comprises a plurality of paper distributing rollers for feeding the printing paper from the paper guide to the pair of pressure rollers.

14. The color printer as claimed in claim 7, wherein the cartridge body is positioned horizontally and the film paper section and the printing paper section are thereby located on the same level, the fiber optics cathode ray tube, the means for feeding, the means for withdrawing and the pair of pressure rollers being located above the cartridge body when the cartridge body is mounted in the printer.

15. The color printer as claimed in claim 7, wherein the means for discharging withdraws film paper from the discharge hole located on an upper side of the cartridge body, the film paper withdrawn from the cartridge body being located above the printing papers in the printing paper section of the cartridge body.

* * * * *